(12) United States Patent  (10) Patent No.: US 8,461,869 B1
Rahim et al.  (45) Date of Patent: Jun. 11, 2013

(54) APPARATUS FOR CONFIGURING PERFORMANCE OF FIELD PROGRAMMABLE GATE ARRAYS AND ASSOCIATED METHODS

(75) Inventors: Irfan Rahim, Milpitas, CA (US); Andy L. Lee, San Jose, CA (US); Bruce B. Pedersen, Sunnyvale, CA (US); Jeffrey T. Watt, Palo Alto, CA (US); Mao Du, Cupertino, CA (US); Richard G. Cliff, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 77 days.

(21) Appl. No.: 13/214,147

(22) Filed: Aug. 19, 2011

(51) Int. Cl.
*H03K 19/003* (2006.01)
(52) U.S. Cl.
USPC .................... 326/33; 326/32; 326/41; 326/47
(58) Field of Classification Search
USPC .................................. 326/31–33, 39, 41, 47
See application file for complete search history.

(56) References Cited

U.S. PATENT DOCUMENTS

| | | | | |
|---|---|---|---|---|
| 7,112,997 B1 * | 9/2006 | Liang et al. | ..................... | 326/81 |
| 7,129,745 B2 * | 10/2006 | Lewis et al. | ..................... | 326/38 |
| 7,348,827 B2 * | 3/2008 | Rahim et al. | ................... | 327/534 |
| 7,368,976 B2 * | 5/2008 | Gupta et al. | ................... | 327/534 |
| 7,986,160 B2 * | 7/2011 | Hoang et al. | ..................... | 326/30 |
| 2007/0040577 A1 * | 2/2007 | Lewis et al. | ..................... | 326/41 |
| 2011/0063937 A1 * | 3/2011 | Eid et al. | ........................ | 365/226 |

\* cited by examiner

*Primary Examiner* — Jason M Crawford
(74) *Attorney, Agent, or Firm* — Law Offices of Maximilian R. Peterson (57) ABSTRACT

An apparatus includes a temperature sensor, a voltage regulator, and a field programmable gate array (FPGA). The temperature sensor and the voltage regulator are adapted, respectively, to provide a temperature signal, and to provide at least one output voltage. The FPGA includes at least one circuit adapted to receive the at least one output voltage of the voltage regulator, and a set of monitor circuits adapted to provide indications of process and temperature for the at least one circuit. The FPGA further includes a controller adapted to derive a body-bias signal and a voltage-level signal from the temperature signal, from the indications of process and temperature for the at least one circuit, and from the at least one output voltage of the voltage regulator. The controller is further adapted to provide the body-bias signal to at least one transistor in the at least one circuit, and to provide the voltage-level signal to the voltage regulator.

25 Claims, 10 Drawing Sheets

Fig. 10

APPARATUS FOR CONFIGURING PERFORMANCE OF FIELD PROGRAMMABLE GATE ARRAYS AND ASSOCIATED METHODS

CROSS-REFERENCE TO RELATED APPLICATIONS

This patent application relates to U.S. patent application Ser. No. 13/214,144, titled "Apparatus for Improving Performance of Field Programmable Gate Arrays and Associated Methods," filed on Aug. 19, 2011.

TECHNICAL FIELD

The disclosed concepts relate generally to electronic circuitry and devices such as field-programmable gate arrays (FPGAs) and, more particularly, to apparatus for configuring or improving or optimizing the performance of FPGAs, and associated methods.

BACKGROUND

Advances in electronics have resulted in an increasing number of functions and capabilities being realized by semiconductor devices, for example, integrated circuits (ICs) such as FPGAs. To provide those functions and capabilities, semiconductor devices, such as FPGAs, continue to include an increasing number of transistors.

To reduce cost and yet meet the specifications for more functions and capabilities, semiconductor technology has continued to drive the trend towards higher device density and smaller device geometries. Those trends have in turn resulted in increased power dissipation in ICs, such as FPGAs.

SUMMARY

A wide variety of embodiments according to the disclosed concepts may be used to configure, optimize, or improve the performance of electronic circuitry, such as FPGAs. According to an exemplary embodiment, an apparatus includes a temperature sensor, a voltage regulator, and a field programmable gate array (FPGA). The temperature sensor and the voltage regulator are adapted, respectively, to provide a temperature signal, and to provide at least one output voltage. The FPGA includes at least one circuit adapted to receive the at least one output voltage of the voltage regulator, and a set of monitor circuits adapted to provide indications of process and temperature for the at least one circuit. The FPGA further includes a controller adapted to derive a body-bias signal and a voltage-level signal from the temperature signal, from the indications of process and temperature for the at least one circuit, and from the at least one output voltage of the voltage regulator. The controller is further adapted to provide the body-bias signal to at least one transistor in the at least one circuit, and to provide the voltage-level signal to the voltage regulator.

According to another exemplary embodiment, a method of operating an FPGA includes sensing a temperature of an operating environment of the FPGA, and monitoring at least one circuit in the FPGA to determine indications of process and temperature. The method further includes generating a body-bias signal derived from the sensed temperature and from the determined indications of process and temperature, and generating a voltage-level signal derived from the sensed temperature and from the determined indications of process and temperature.

According to yet another exemplary embodiment, an apparatus includes a temperature sensor adapted to provide a temperature signal, a voltage regulator, adapted to provide at least one output voltage, and an FPGA. The FPGA includes at least one circuit in the FPGA adapted to receive the at least one output voltage of the voltage regulator, and a set of monitor circuits adapted to provide indications of process and temperature for the at least one circuit. The FPGA further includes a controller adapted to generate and to provide to the at least one circuit a body-bias signal and a voltage-level signal from the temperature signal, from the indications of process and temperature for the at least one circuit, and from the at least one output voltage of the voltage regulator. The body-bias signal and the voltage-level signal are generated so as to improve a performance of the at least one circuit while meeting a thermal budget of the at least one circuit.

BRIEF DESCRIPTION OF THE DRAWINGS

The appended drawings illustrate only exemplary embodiments and therefore should not be considered as limiting its scope. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to electronic circuitry and devices such as field-programmable gate arrays (FPGAs) and, more particularly, to apparatus for configuring or programming or adjusting the performance of FPGAs, and associated methods. One aspect of the disclosed concepts relates to adjusting or providing body-bias levels and supply voltage(s) of at least some part, block, circuit, or resource in an FPGA based on monitored levels or indications of process, voltage, and temperature (PVT). In addition, the ambient temperature, or the temperature of the environment in which the FPGA operates, is also monitored or measured.

Generally speaking, the ambient temperature (or the temperature of the FPGA operating environment), and process, voltage, and temperature are monitored or measured for one or more circuits in the FPGA to determine indications of process, voltage, and temperature in order to provide body-bias signals and supply voltage level(s) to one or more circuits in the FPGA. As described below in detail, in some embodiments, configuration information about the one or more circuits in the FPGA may also be taken into account. For example, the body-bias value(s) or level(s) and/or the power supply voltage level(s) may be determined based on whether a circuit or block has been configured for relatively low-speed and relatively low power-consumption or whether the circuit or block has been configured for relatively high speed and relatively high power-consumption.

Based on the above information, body-bias level(s) and power supply voltage level(s) are determined and applied to the one or more circuits. As a result, the performance of the one or more circuits may be configured, optimized, maximized or adjusted. This process may occur dynamically and on a continued basis.

Figure 1:
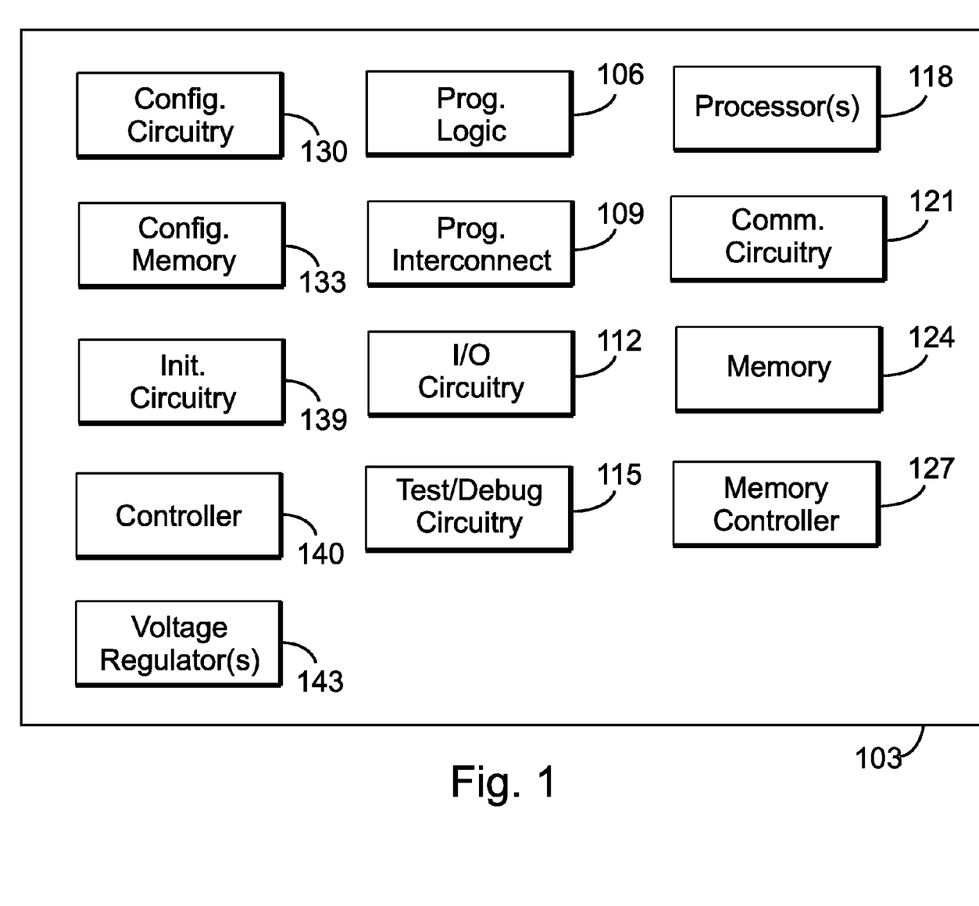
FIG. 1 illustrates a block diagram of an FPGA according to an exemplary embodiment.

FIG. 1 illustrates a general block diagram of an FPGA 103 according to an exemplary embodiment. FPGA 103 includes configuration circuitry 130, configuration memory (CRAM) 133, controller 140, programmable logic 106, programmable interconnect 109, and I/O circuitry 112. In addition, FPGA 103 may include test/debug circuitry 115, one or more processors 118, one or more communication circuitry 121, one or more memories 124, one or more controllers 127, and initialization circuit 139, as desired. In some embodiments, FPGA 103 may also include one or more voltage regulators or power supply circuits 143.

Note that the figure shows a general block diagram of FPGA 103. Thus, FPGA 103 may include other blocks and circuitry, as persons of ordinary skill in the art understand. Examples of such circuitry include clock generation and distribution circuits, and the like. Furthermore, FPGA 103 may include analog circuitry, other digital circuitry, and/or mixed-signal circuitry, fuses, anti-fuses, and the like, as desired.

Programmable logic 106 includes blocks of configurable or programmable logic circuitry, such as look-up tables (LUTs), product-term logic, pass gates, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside FPGA 103 (for example, by using pass gates and/or MUXs). In some embodiments, programmable logic 106 and/or programmable interconnect 109 may include fuses and/or anti-fuses to provide additional flexibility or programmability.

Initialization circuit 139 may cause the performance of various functions at reset or power-up of FPGA 103. At or after power-up, FPGA 103 obtains configuration information, typically from an external device. Based on the configuration information, various blocks or devices within the FPGA core or fabric, or other blocks or resources in FPGA 103, are configured or programmed. Examples include programmable logic 106 and programmable interconnect 109.

I/O circuitry 112 may constitute a wide variety of I/O devices or circuits. I/O circuitry 112 may couple to various parts of FPGA 103, for example, programmable logic 106 and programmable interconnect 109. I/O circuitry 112 provides a mechanism and circuitry for various blocks within FPGA 103 to communicate with external circuitry or devices.

Test/debug circuitry 115 facilitates the testing and troubleshooting of various blocks and circuits within FPGA 103. Test/debug circuitry 115 may include a variety of blocks or circuits known to persons of ordinary skill in the art. For example, test/debug circuitry 115 may include circuits for performing tests after FPGA 103 powers up or resets, as desired. Test/debug circuitry 115 may also include coding and parity circuits, as desired.

FPGA 103 may include one or more processors 118. Processor 118 may couple to other blocks and circuits within FPGA 103. Processor 118 may receive data and information from circuits within or external to FPGA 103 and process the information in a wide variety of ways, as persons skilled in the art understand. One or more of processor(s) 118 may constitute a digital signal processor (DSP). DSPs allow performing a wide variety of signal processing tasks, such as compression, decompression, audio processing, video processing, filtering, and the like, as desired.

FPGA 103 may also include one or more communication circuit(s) 121. Communication circuit(s) 121 may facilitate data and information exchange between various circuits within FPGA 103 and circuits external to FPGA 103, as persons of ordinary skill in the art understand. Examples of communication circuit 121 include transceivers, network interface circuits, etc.

FPGA 103 may further include one or more memories 124 and one or more memory controller(s) 127. Memory 124 allows the storage of various data and information (such as user-data, intermediate results, calculation results, etc.) within FPGA 103. Memory 124 may have a granular or block form, as desired.

Memory controller 127 allows interfacing to, and controlling the operation and various functions of, circuitry outside the FPGA. For example, memory controller 127 may interface to and control an external synchronous dynamic random access memory (SDRAM).

Controller 140 in part provides or determines or adjusts body-bias value(s) for one or more circuits in FPGA 103. More specifically, the body-bias value(s) are selected or derived from process and temperature information or indications about the circuit(s) at issue, from the ambient or operating environment temperature of the FPGA and, in some embodiments, from configuration information about the circuit(s).

In some embodiments, in addition to, or instead of, the foregoing parameters, the body-bias value(s) may be selected or derived from thermal budget(s) of the circuit(s) in FPGA 103. The thermal budget(s) of the circuit(s) specify or prescribe the thermal operating conditions of the circuit(s). In some embodiments, the thermal budget(s) may be determined or selected by taking into account the configuration information about the respective circuits, such as the desired or minimum or average or peak operating speed of one or more transistors, blocks, and the like, in the respective circuits.

The thermal budget(s) may be determined or selected based a variety of factors, such as safe operating area, desired operating thermal profiles for various circuits (e.g., desired operating temperatures), maximum operating temperatures, etc., as persons of ordinary skill in the art understand. For example, in some embodiments, a thermal budget may specify an average operating or junction temperature (for one or more semiconductor junctions, such as PN junctions well known to persons of ordinary skill in the art) in a respective circuit.

As another example, in some embodiments, a thermal budget may specify a peak or maximum operating or junction temperature (for one or more semiconductor junctions, such as PN junctions) in a respective circuit. As yet another example, in some embodiments, a thermal budget may specify a operating or junction temperature (for one or more semiconductor junctions, such as PN junctions) for a respective circuit, and an indication of how long (e.g., how many cycles of the clock signal for the respective circuit or FPGA 103).

The body-bias value(s) determine or influence the performance of one or more transistors, or groups of transistors, within FPGA 103. For example, the body-bias value(s) affect the speed of operation of the transistor(s), power dissipation of the circuit(s) in which the transistor(s) reside, etc. The body-bias value(s) also affect whether the circuit(s) meet their respective thermal budget(s).

Figure 2:
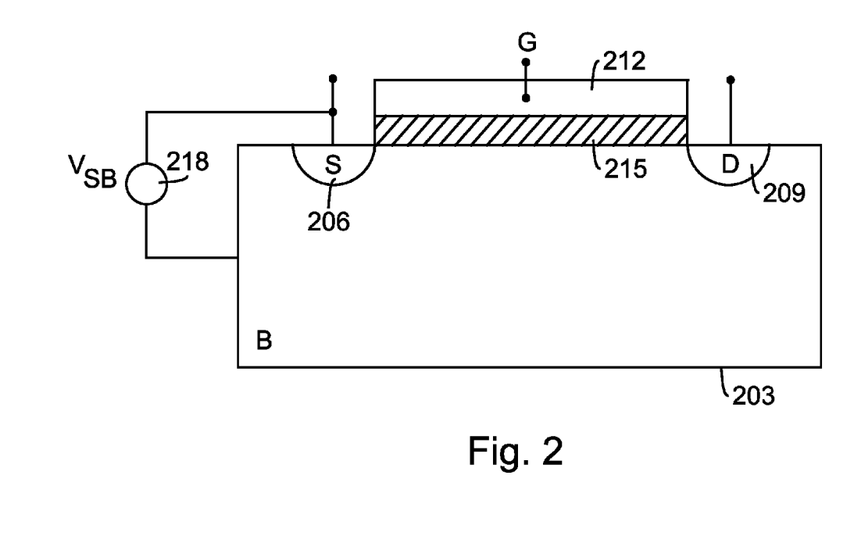
FIG. 2 shows a metal oxide semiconductor (MOS) transistor used in FPGAs according to exemplary embodiments.

As noted, body-bias values for transistors affect their operating characteristics, such as operating speed, current-drive capability, etc. FIG. 2 shows a MOS transistor used in FPGAs according to exemplary embodiments. The MOS transistor includes body (or substrate) region 203, source region 206, drain region 209, gate insulator 215, and gate 212. The drain current of the MOS transistor in the saturation region of operation depends on the threshold voltage and the gate-to-source voltage of the transistor:

$$i_D = K(v_{GS} - V_T)^2, \quad (1)$$

where $i_D$=the total drain current (i.e., including AC and DC components),

K=a constant, $v_{GS}$=the total gate-to-source voltage (i.e., including AC and DC components), and $V_T$=the threshold voltage.

The threshold voltage, $V_T$, depends on a number of factors, such as the voltage between source region 206 and body region 203 of the transistor. The following equation provides the threshold voltage as a function of the body-to-source voltage:

$$V_T = V_{T(0)} + \gamma\{\sqrt{2\phi_F - v_{BS}} - \sqrt{2\phi_F}\}. \quad (2A)$$

Alternatively, one may write Equation 2A in terms of the source-to-body voltage:

$$V_T = V_{T(0)} + \gamma\{\sqrt{2\phi_F + v_{BS}} - \sqrt{2\phi_F}\}, \quad (2B)$$

where $V_{T(0)}$=the threshold voltage with the source-to-body voltage (or body-to-source voltage) set to zero, γ=the body factor, a constant that depends on the doping levels of the body, $\phi_F$=a constant, $v_{BS}$=the total body-to-source voltage (i.e., including AC and DC components), and $v_{SB}$=the total source-to-body voltage (i.e., including AC and DC components).

Note that when the body-to-source voltage, $v_{BS}$ (or source-to-body voltage, $v_{SB}$) equals zero, the threshold voltage, $V_T$, equals $V_{T(0)}$.

As Equation 2B shows, for a finite body factor, γ the transistor's threshold voltage increases as the source-to-body voltage, $v_{SB}$, increases. Equation 1, however, indicates that for a given gate-to-source voltage an increase in the threshold voltage decreases the drain current, $i_D$, of the transistor. In other words, according to Equations 1 and 2B, for a constant gate-to-source-voltage, $v_{GS}$, an increase in the source-to-body voltage, $v_{SB}$, causes an increase in the threshold voltage, $V_T$.

An increased threshold voltage, $V_T$, in turn causes a decrease in the quantity ($v_{GS} - V_T$) and, consequently, a decrease in the drain current, $i_D$, of the transistor. Thus, for a constant gate-to-source-voltage, $v_{GS}$, an increase in the source-to-body voltage, $v_{SB}$, causes a decrease in the current-drive capability (one measure of performance) of the transistor. The decreased current-drive capability of the transistor in turn leads to slower circuit operation and, ultimately, to slower operation of the FPGA that includes the transistor.

The power dissipation of the transistor also varies according to changes in its threshold voltage. More specifically, a smaller threshold voltage increases the OFF-state leakage current ($I_{off}$) of the transistor, and vice-versa. The $I_{off}$ of the transistor affects its static (non-switching) power dissipation. In addition, a smaller threshold voltage decreases the dynamic or switching power dissipation of the transistor. Thus, changing the threshold voltage by adjusting the body bias affects the power dissipation of the MOS transistor.

Furthermore, for a given supply voltage, $V_{DD}$, an increase in the threshold voltage, $V_T$, limits the maximum voltage that the transistor can transmit when operating as a pass transistor. In other words, if the threshold voltage, $V_T$, increases to the point that it equals or exceeds the gate-to-source-voltage, $v_{GS}$, the drain current reduces to zero. Thus, a voltage applied to the drain of the transistor, for example, a voltage that corresponds to a logic 1 level, fails to properly transmit to the source of the transistor. Consequently, the transistor fails to operate reliably as a pass transistor.

Note that the source-to-body voltage, $v_{SB}$, may be positive or negative. A positive source-to-body voltage, $v_{SB}$, provides forward body-bias. Conversely, a negative source-to-body voltage, $v_{SB}$, causes reverse body-bias of the transistor. Part of the forward body-bias flows into the body or substrate. Nevertheless, forward body-bias can increase or improve operating speed of the transistor in the presence of relatively high leakage currents.

As the above description shows, one may affect the performance of the MOS transistor by adjusting its body bias and hence its source-to-body voltage (ultimately resulting in a change in its threshold voltage). Adjusting the body bias affects performance measures such as current-drive capability, speed of operation, power dissipation, etc.

Referring to FIG. 1, in addition to providing body-bias value(s), controller 140 determines or adjusts the output voltage(s) of one or more voltage regulators that supply one or more voltages to various circuit(s) in FPGA 103. The output voltage(s) are selected or derived from process and temperature information or indications about the circuit(s) at issue, from the ambient or operating environment temperature of the FPGA and, in some embodiments, from configuration information about the circuit(s).

In exemplary embodiments, controller 140 may cause the output voltage(s) of the regulators to increase, decrease, or stay unchanged or substantially or nearly unchanged. The regulator output voltage(s) determine or influence the performance of one or more transistors, or groups of transistors, within FPGA 103. For example, the voltage values affect the speed of operation of the transistor(s), power dissipation or consumption of the circuit(s) in which the transistor(s) reside, junction temperatures of transistor(s) (and therefore of the circuit(s) in which the transistor(s) reside), etc.

Figure 3:
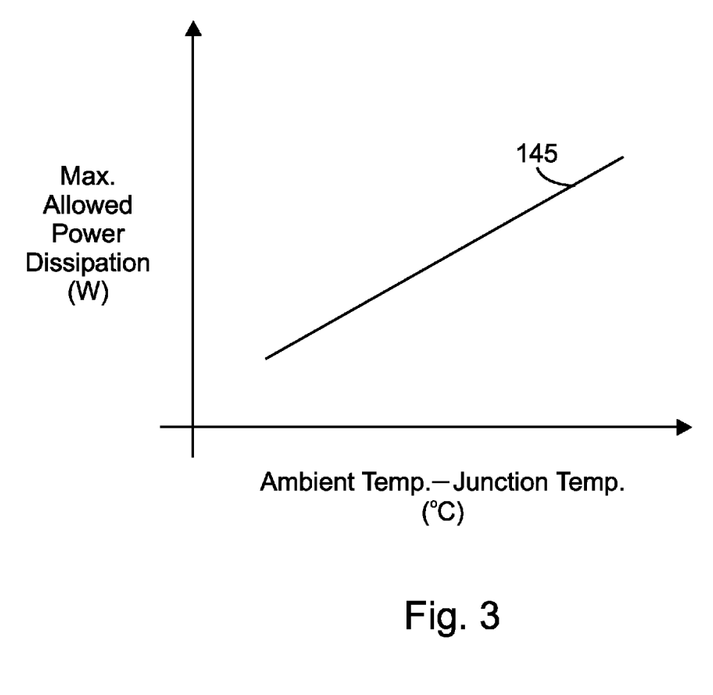
FIG. 3 illustrates a graph of the relationship between maximum allowed power dissipation and the difference between the ambient temperature (or temperature of the operating environment of the FPGA) and junction temperature in an exemplary embodiment.

FIG. 3 illustrates a graph 145 of the relationship between maximum allowed (or safe) power dissipation or consumption and the difference between the ambient temperature (or temperature of the operating environment of the FPGA) and junction temperature in an exemplary embodiment. Graph 145 may pertain to one or more resources in FPGA 103, such the resources and circuits described above.

As graph 145 shows, the maximum allowed power dissipation increases as the difference between the ambient temperature and junction temperature(s) increases. For example, if the ambient temperature stays constant and the junction temperature increases, then the FPGA resource may dissipate less power (its power and/or thermal budget changes, e.g., decreases), and vice-versa. Likewise, if the junction temperature stays constant and ambient temperature increases, then the FPGA resource may dissipate less power (its power and/or thermal budget changes, e.g., decreases), and vice-versa. If both the ambient and junction temperatures increase, then the FPGA resource may dissipate less power (its power and/or thermal budget changes, e.g., decreases), and vice-versa.

Put another way, the difference between the ambient temperature and junction temperature(s) determines the amount of headroom or margin in allowed power dissipation available to various FPGA resources. Based on the headroom or margin, controller 140 selects or adjusts the output voltage(s) of the regulator(s). For example, controller 140 may decrease one or more output voltage(s) if the margin in allowed power dissipation is relatively small or falls below a threshold, and vice-versa.

In some embodiments, if the margin in allowed power dissipation is relatively large or exceeds a threshold, controller 140 may cause one or more output voltage(s) of regulator(s) to increase. In other words, in such a scenario, controller 140 may cause the voltage regulator(s) to overdrive the FPGA resources to which they supply power.

Power dissipation or consumption includes two elements, static and dynamic. The static component typically results from leakage. Adjustment of the body-bias value(s) and/or power supply voltages affects leakage and, therefore, static power dissipation. By adjusting body-bias value(s) and power supply voltage(s) for one or more transistors, circuits, blocks, etc. in FPGA 103, the static power dissipation of such FPGA resources (and therefore of the FPGA itself) may be controlled, adjusted, configured, or programmed. In some embodiments, the control, adjustment, configuration, or programming may be repeated over time, i.e., on a dynamic basis.

Dynamic power dissipation typically arises from the switching of transistors in FPGA 103. The dynamic power dissipation typically depends on several factors, such as the frequency of operation (the switching of transistor(s)), the supply voltage, and the load of a circuit. In the case of complementary metal oxide semiconductor (CMOS) fabrication technology, the dynamic power dissipation, $P_D$, of a circuit or block generally follows the equation:

$$P_D = \tfrac{1}{2} f C V_{DD}^2, \tag{3}$$

where f, C, and $V_{DD}$ denote, respectively, the frequency of operation, load capacitance, and supply voltage. As the equation (3) above indicates, changing the load capacitance, the frequency of operation, and/or the supply voltage affects the dynamic power dissipation of a given circuit or resource within FPGA 103.

The load capacitance and the frequency of operation typically depend on the fabrication technology of the FPGA, and its configuration to implement a user's design. The fabrication technology, for example, width of interconnects, thickness of dielectric layers, etc., determine at least in part the load capacitance. The load capacitance also depends on the type and number of follow-on (load) circuits. During configuration of the FPGA, computer-aided (CAD) software maps the user's circuit to resources within FPGA 103, thus (in part) determining the load capacitance.

The CAD software also selects the frequency of operation (or at least an initial frequency of operation) of some, if not all, FPGA resources used in a given configuration, e.g., a configuration to implement a user's design. The selected frequency helps achieve timing closure for the user's circuit. In some embodiments, controller 140 may change the frequency of operation of one or more resources (e.g., transistors, circuits, blocks, etc.) by changing body-bias value(s).

Figure 4:
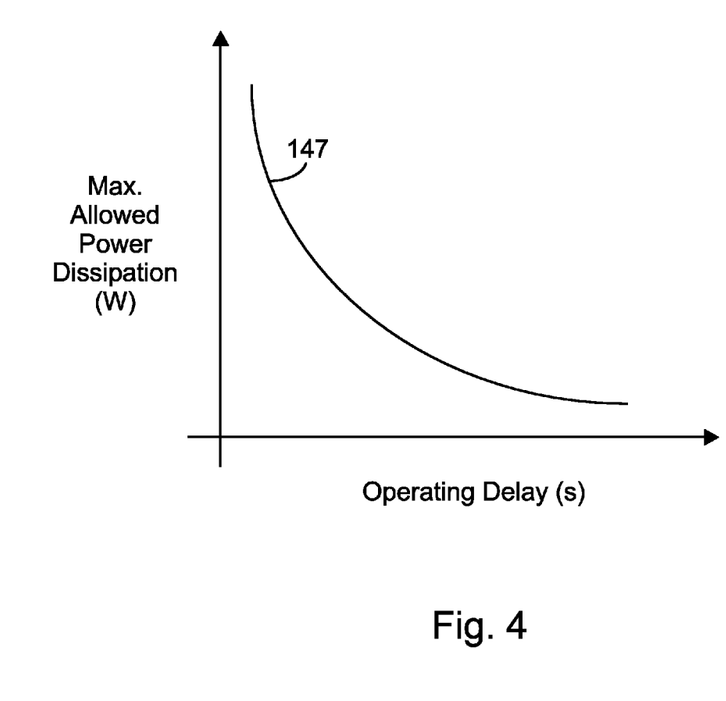
FIG. 4 depicts a graph of the relationship between maximum allowed power dissipation and operating delay of an FPGA resource in an exemplary embodiment.

FIG. 4 depicts a graph 147 of the relationship between maximum allowed (or safe) power dissipation and operating delay (inverse of operating frequency) of an FPGA resource in an exemplary embodiment. As graph 147 illustrates, at relatively low operating delays (i.e., relatively high operating frequencies), the allowed power dissipation is higher (but subject to a thermal budget, as the junction temperatures in the FPGA resources rise as a function of increasing frequency of operation). At relatively high operating delays (i.e., relatively low operating frequencies), the allowed power dissipation is lower. By changing the body-bias value(s) and supply voltage(s) (i.e., the output voltage(s) of regulator(s)), controller 140 causes improvement or optimization of various FPGA resources, while limiting power dissipation to safe or prescribed levels.

The CAD software may specify an initial supply voltage for various resources in FPGA 103 so as to meet the timing, speed, power consumption or power budget, and/or thermal budget or specifications for the user's design. During operation of FPGA 103, controller 140 may change one or more supply voltages (e.g., output voltage(s) of one or more regulators) in order to improve or optimize the performance of the respective resources and, hence, of FPGA 103. The change of the supply voltage(s) depends on a variety of factors, such as junction temperature(s), ambient temperature, etc., as described above.

In exemplary embodiments, one may adjust the body bias and/or supply voltage of individual transistors, individual circuits or blocks within the FPGA, groups of transistors or blocks, or even the entire FPGA, as desired. Furthermore, one may control the body bias and/or supply voltage of individual NMOS and PMOS transistors, or the body biases of groups of NMOS and PMOS transistors, as desired. The following description provides the details.

As noted, in some embodiments, the fabric or core of an FPGA may be allocated as circuit blocks corresponding to one or more configurations. The fabric or core of FPGA 103 may take a variety of forms. In some embodiments, the core circuitry of FPGA 103 includes, among other circuitry, programmable logic 106 and programmable interconnect 109.

Programmable logic 106 and programmable interconnect 109 often reside within FPGA 103 in an array or regular structure, for example, a two-dimensional array. Thus, in some embodiments, the fabric or core of FPGA 103 may be arranged in rows and columns.

Figure 5:
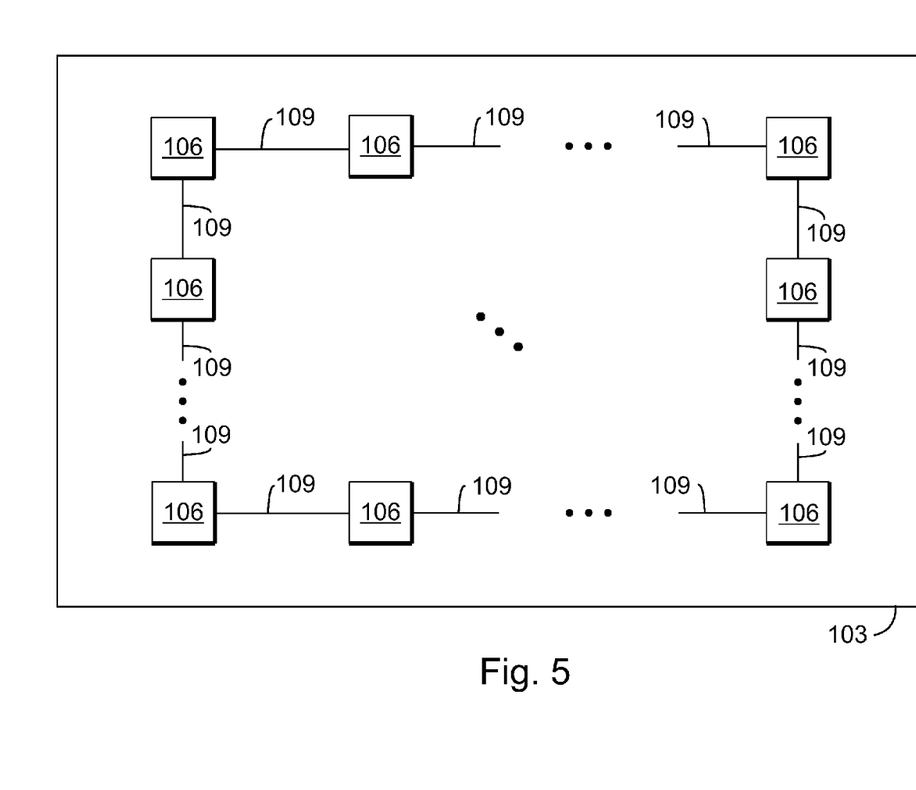
FIG. 5 shows a floor-plan of an FPGA according to an exemplary embodiment.

FIG. 5 depicts a floor-plan of FPGA 103 according to an exemplary embodiment. FPGA 103 includes programmable logic 106 arranged as a two-dimensional array. Programmable interconnect 109, arranged as horizontal interconnect segments and vertical interconnect segments, couples the blocks of programmable logic 106 to one another.

One may place the blocks in a particular manner so as to implement a user's design, as persons of ordinary skill in the art understand. A block, part of a block, or a set of blocks may constitute a tile or region of FPGA 103. FPGA 103 may thus include a number of tiles, arranged in a desired configuration (e.g., as two halves, four quadrants, etc.), as persons of ordinary skill in the art understand. In other embodiments, FPGA 103 may include rows and/or columns of circuitry or blocks of circuitry.

Figure 6:
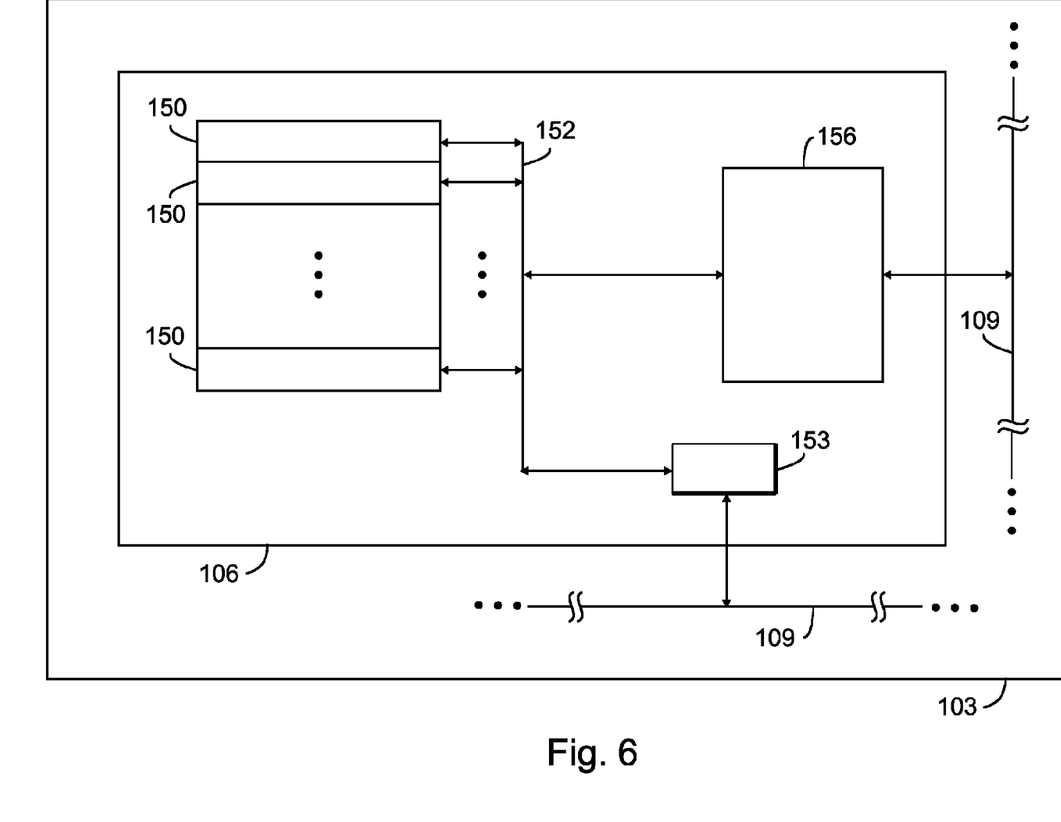
FIG. 6 depicts a block diagram of programmable logic and programmable interconnect in an FPGA according to an exemplary embodiment.

The core or fabric of FPGA 103 may include a more granular structure of programmable circuitry (e.g., programmable logic, programmable interconnect, etc.). FIG. 6 shows a block diagram of programmable logic 106 and programmable interconnect 109 in FPGA 103 according to an exemplary embodiment. In the exemplary embodiment shown, programmable logic 106 includes logic elements or programmable logic elements, circuits, or blocks 150, local interconnect 152, interface circuit 153, and interface circuit 156.

Logic elements 150 provide configurable or programmable logic functions, for example, LUTs, flip-flops, registers, product-term logic, etc., as persons of ordinary skill in the art understand. Local interconnect 152 provides a configurable or programmable mechanism for logic elements 150 to couple to one another or to programmable interconnect 109 (sometimes called "global interconnect"), as desired. Interface circuit 156 and interface circuit 153 provide a configurable or programmable way for programmable logic 106 block of circuitry to couple to programmable interconnect 109 (and hence to other programmable logic 106).

Interface circuit 156 and interface circuit 153 may include MUXs, DEMUXs, registers, buffers, pass gates, drivers, and the like, as persons of ordinary skill in the art understand. At a higher level, one may combine a number of logic elements 150 and associated circuitry to realize a larger programmable block. One may repeat this process as desired or appropriate in a given situation to generate programmable blocks of circuitry with a desired level of granularity of programmability.

Various circuits or blocks within FPGA 103 may be treated as circuit elements and have corresponding levels of body bias and/or supply voltage. In exemplary embodiments, a variety of levels of granularity for the allocation of circuit elements may be used. For example, in some embodiments, one may treat individual transistors (e.g., a transistor acting as a pass-gate) as a circuit element. As another example, circuit elements in programmable logic 106 may have one or more body-bias levels and/or supply voltage(s).

Furthermore, one may adjust the body bias and/or supply voltage of each portion or block of circuitry independently of others, on an individual or collective basis, as desired. Within each portion or block of circuitry, one may adjust the body bias and/or supply voltage of each sub-block or transistor, or groups of sub-blocks or transistors, on an individual or collective basis, as desired.

In some embodiments, a logic element (or a component or block within the logic element) or a set of logic elements may have a corresponding body-bias level and/or supply voltage. Other examples will be apparent to persons of ordinary skill in the art, for example, blocks of logic elements, tiles, quadrants, rows, columns, etc.

One may adjust the body bias and/or supply voltage of all or a portion of the following circuitry within an FPGA according to exemplary embodiments: one or more of the blocks in FIG. 1 (e.g., programmable logic 106, programmable interconnect 109, etc.); one or more logic elements 150 within one or more programmable logic blocks 106; one or more interface circuits 256 and/or 259, within one or more programmable logic blocks 106; one or more local interconnect within one or more programmable logic 106; and one or more MUXs, drivers, buffers, etc., within one or more interface circuits 256 and/or 259.

Similarly, various parts or blocks of circuitry within programmable interconnect 109 may have corresponding body-bias level(s) and/or supply voltage(s). For instance, one or more local interconnects may have corresponding body-bias level(s) and/or supply voltage(s). As another example, one or more global interconnects (or parts of one or more such interconnects) may have corresponding body-bias level(s) and/or supply voltage(s). Other examples will be apparent to persons of ordinary skill in the art, depending on factors such as the architecture of the FPGA in question, the level of granularity of the FPGA's core or fabric, etc.

In addition to, or instead of, programmable logic 106 and programmable interconnect 109, other circuits or blocks within FPGA 103 may have corresponding body-bias level(s) and/or supply voltage(s). For example, in some embodiments, memory 124 may be implemented as blocks of memory within FPGA 103. One or more blocks of memory within memory 124 may have corresponding body-bias level(s) and/or supply voltage(s).

Similar possibilities exist with respect to processor(s) 118, communication circuit(s) 121, I/O circuitry 112, etc. Generally speaking, parts, or all, of one or more circuits or blocks of circuits in FPGA 103 may have corresponding body-bias level(s) and/or supply voltage(s) that may be adjusted or set according to exemplary embodiments.

As noted above, one may make the body-bias and/or supply voltage adjustments in any desired level of granularity. In other words, one may make the adjustments applicable to individual transistors, groups of transistors, sub-blocks, blocks, or the entire FPGA, as desired, and as applicable. For example, one may make body-bias and/or supply voltage adjustments to one or more NMOS transistors independently of one or more PMOS transistors, as desired.

Furthermore, one may adjust the body bias and/or supply voltage of one element in FPGA 103 independently of all other elements, as desired. As persons of ordinary skill in the art understand, one may adjust the body bias and/or supply voltage of some parts of a FPGA, and yet provide a fixed or default body bias and/or supply voltage for other parts of the FPGA, as desired.

Figure 7:
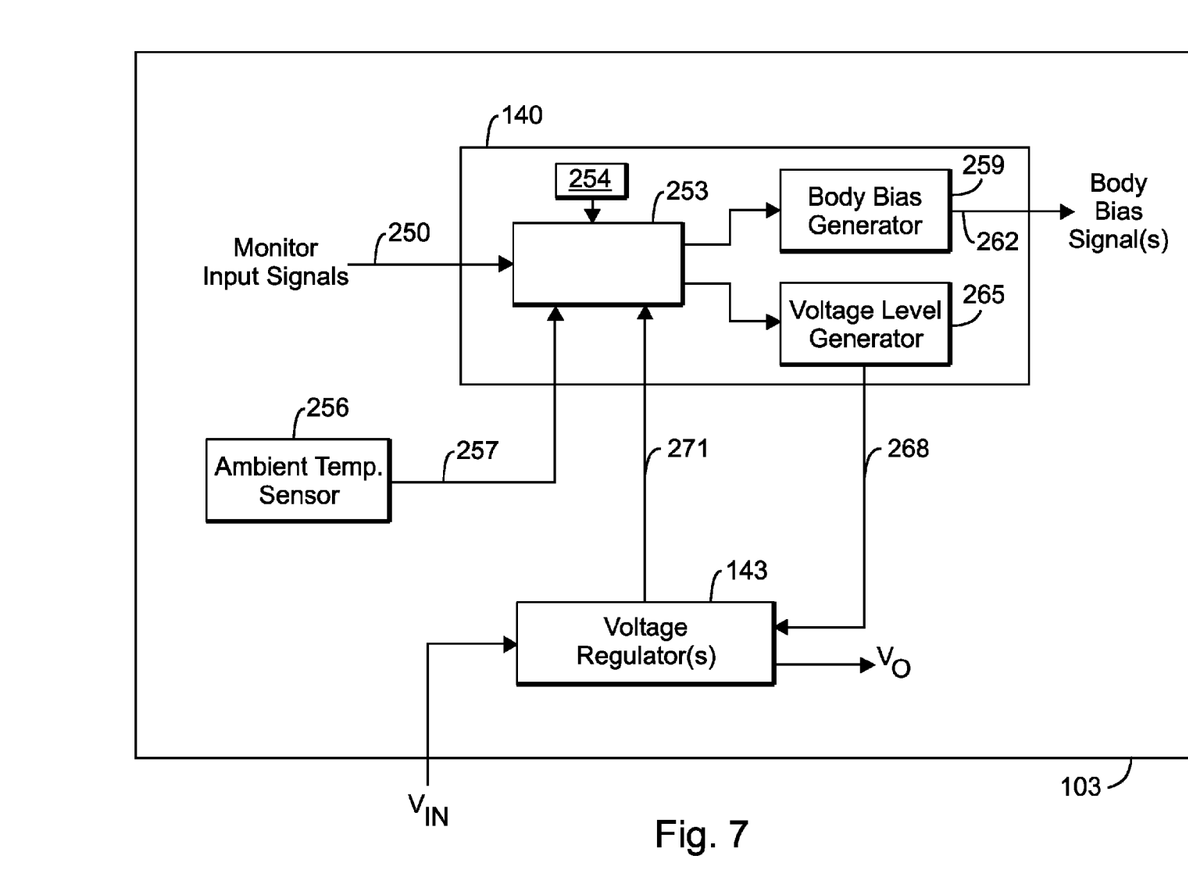
FIG. 7 illustrates a block diagram of a circuit arrangement for configuring or improving or optimizing the performance of an FPGA according to an exemplary embodiment.

FIG. 7 illustrates a block diagram of a circuit arrangement for configuring or improving or optimizing the performance of an FPGA according to an exemplary embodiment. The circuit arrangement includes controller 140, ambient temperature sensor 256, and voltage regulator 143. Controller 140 may provide the functionality described above.

Ambient temperature sensor 256 senses the ambient or operating temperature of FPGA 103, as described above. Ambient temperature sensor 256 provides to controller 140 a measure or indication of the ambient or operating temperature as temperature signal 257. In some embodiments, ambient temperature sensor 256 may be mounted near an external surface or side of the packaging of FPGA 103 in order to facilitate the sensing of the ambient or operating temperature.

Controller engine 253 receives as one or more inputs monitor input signal(s) 250 from one or more monitor circuits (not shown). A number of monitor circuits may be used within FPGA 103, as desired. The number and location of the monitor circuits depends on several factors, such as the level of granularity of body-bias and supply voltage adjustment or control. For example, in some embodiments, a monitor circuit may be used for each FPGA resource whose body-bias is sought to be controlled or adjusted. The location of FPGA resources therefore determines the location of the monitor circuits within FPGA 103. For example, if the FPGA resources at issue constitute programmable logic and programmable interconnect within the core or fabric of FPGA 103, then the monitor circuits may be dispersed within the FPGA 103, for instance in the two-dimensional pattern shown in FIG. 3.

In some embodiments, a monitor circuit may be used for a set of FPGA resources whose body-biases are sought to be controlled or adjusted. The location of FPGA resources therefore determines an appropriate location of the monitor circuit in this situation. For example, the monitor circuit may be located centrally to, or near, the resources. Monitor signal(s) 250 include indications of one or more characteristics of the process, voltage, and temperature (such as one or more junction temperature(s)) of one or more resources within FPGA 103. Examples of such resources include circuits, transistors, blocks, and the like.

The characteristics of the process may include one or more characteristics or parameters relating to the fabrication process used to fabricate FPGA 103 generally, and the respective circuit, transistor, block, and the like, specifically. The temperature characteristics may generally include a measure of the temperature of the respective circuit, transistor, block, and the like.

The voltage characteristics may generally include the supply voltage for the respective circuit, transistor, block, and the like. In some embodiments, the monitor circuit monitors or measures the DC component of the supply voltage. In some embodiments, the monitor circuit monitors or measures the DC and AC components of the supply voltage. In the latter example, the monitor circuit and, hence, body-bias controller 140, can respond to ripple or transients present in the supply voltage.

Controller engine 253 receives body-bias and supply voltage information from reference information circuit 254. Reference information circuit 254 may take a variety of forms, such as a look-up table, memory device, and the like, as persons of ordinary skill in the art understand. Controller engine 253 uses the monitor input signals 250 and information from the reference information circuit 254 to determine body-bias and supply voltage level(s) for one or more resources (e.g., circuit(s), transistor(s), block(s), and the like) in FPGA 103.

In some embodiments, reference information circuit 254 contains look-up information for appropriate ranges of body-bias. Controller engine 253 uses monitor input signals 250 to determine a look-up index that it uses to retrieve one or more body-bias and supply voltage value(s) from reference information circuit 254.

Controller engine 253 uses the body-bias and supply voltage information and the monitored input signals to determine a body-bias and supply voltage(s) for the respective resources in FPGA 103. For example, at relatively low temperature margins, a relatively high forward body-bias and/or supply voltage may be used. Conversely, at relatively high temperature margins, a relatively low forward body-bias and/or supply voltage may be used.

Body-bias generator 259 provides one or more body-bias signals 262 to the respective FPGA resources. Depending on various inputs to controller engine 253, controller engine 253 may cause body-bias generator 259 to adjust the body-bias signal(s). In this manner, the performance, such as power dissipation, speed of operation, etc. of one or more resources (e.g., parts, blocks, circuits, transistors, and the like) of FPGA 103 may be controlled, improved, or optimized dynamically.

One or more voltage regulator(s) 143 provide one or more supply voltages to resources within FPGA 103. More specifically, the regulator(s) 143 receive as an input one or more input voltages (denoted as $V_{IN}$), and generate one or more output voltages (denoted as $V_O$). The output voltage(s) serve as the supply voltages of the respective resources in FPGA 103. Voltage regulator(s) 143 may regulate one or more of the output voltages against variations in load, line, etc., as persons of ordinary skill in the art understand.

Controller engine 253 receives one or more voltage signals 271 from voltage regulator(s) 143. Voltage signal(s) 271 represent measures or indications of the output voltage(s) of regulator(s) 143. Depending on factors such as monitor input signals 250 and temperature signal 257, controller engine determines the temperature margin(s) (the difference between ambient and junction temperature(s)). Based on the temperature margin(s) and voltage signal(s) 271, controller 253 uses voltage level generator 265 to provide voltage control signal(s) 268 to voltage regulator(s) 143. In response to voltage control signal(s) 268, one or more of the output voltage(s) of regulator(s) 143 are adjusted.

In some embodiments, controller engine 253 may provide voltage control signal(s) 268 to regulator(s) 143, rather than use voltage level generator 265. Further, in some embodiments, controller engine 253 may receive voltage signal(s) 271 from the output voltage(s) of regulator(s) 143. The choice of implementation depends on factors such as the topology and circuitry of voltage regulator(s) 143, control circuitry in regulator(s) 143, voltage levels acceptable to or appropriate for circuitry in regulator(s) 143 and controller engine 253, and the like.

Figure 8:
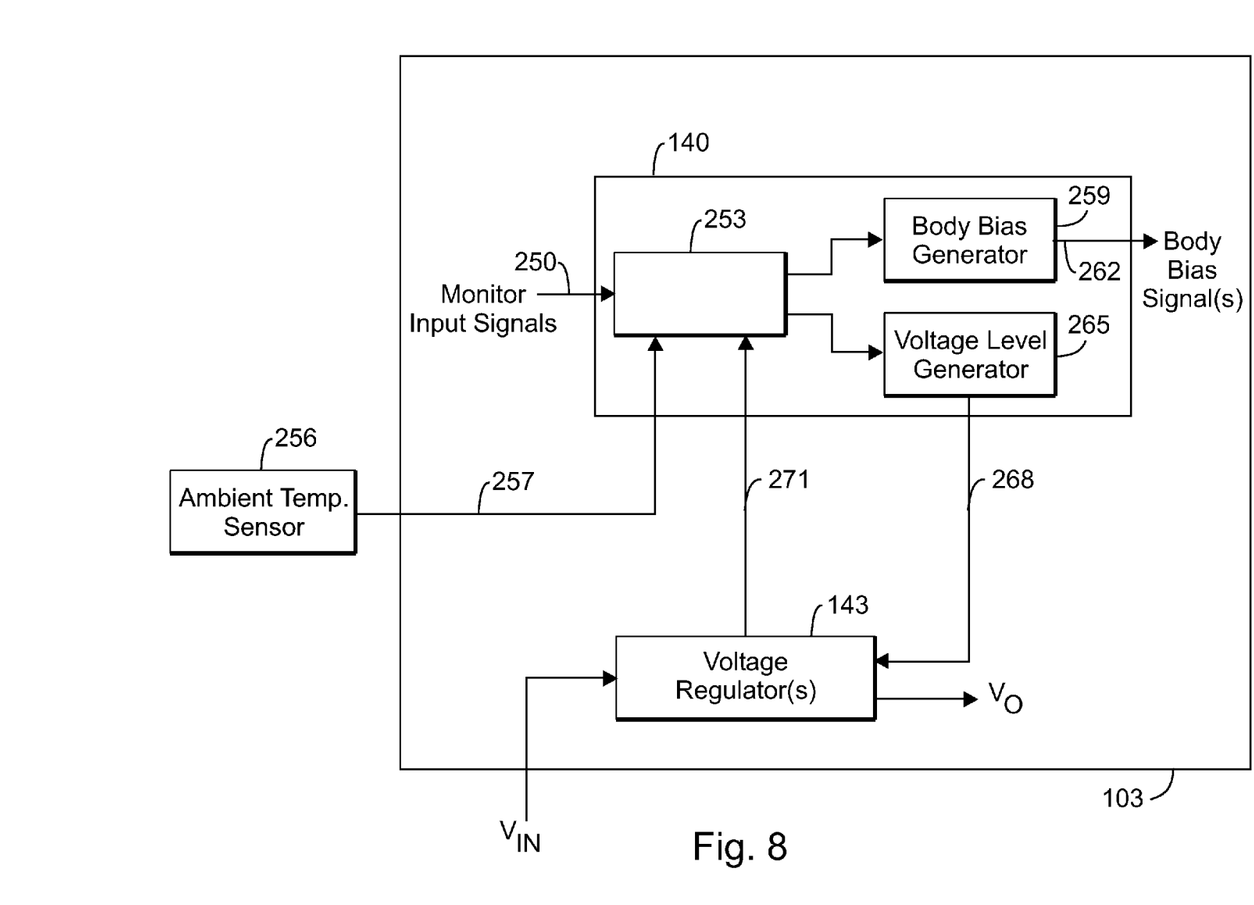
FIG. 8 shows a block diagram of a circuit arrangement for configuring or improving or optimizing the performance of an FPGA according to another exemplary embodiment.

In some situations, placing ambient temperature sensor 256 externally to FPGA 103 (e.g., external to the package or die of FPGA 103) may provide certain advantages. For example, if the expected temperature margin is relatively small, placing ambient temperature sensor 256 outside the package of FPGA 103 may provide more accurate temperature signals 257. As another example, physical limitations may make easier the use of an external ambient temperature sensor 256. FIG. 8 shows a circuit arrangement where ambient temperature sensor 256 resides externally to FPGA 103.

Figure 9:
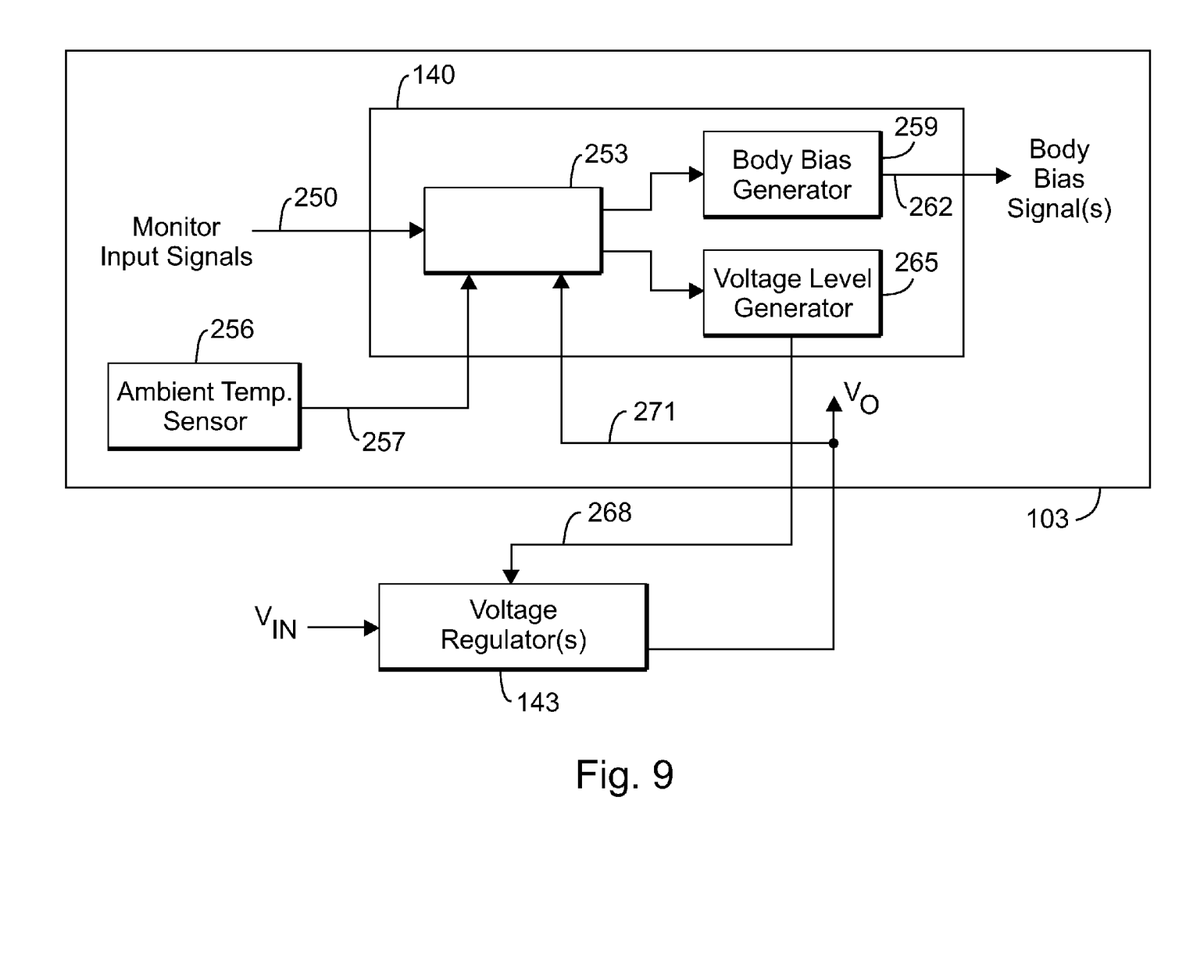
FIG. 9 depicts a block diagram of a circuit arrangement for configuring or improving or optimizing the performance of an FPGA according to yet another exemplary embodiment.

In some cases, FPGA 103 may not include voltage regulator(s). For example, using external regulator(s) may provide cost savings, use of different fabrication technologies, etc. In such cases, voltage regulator(s) 143 may reside externally to FPGA 103, and communicate with FPGA 103 via voltage signal(s) 271 (which may be coupled to the output(s) of regulator(s) 143 and voltage control signal(s) 268. FIG. 9 shows a circuit arrangement where regulator(s) 143 reside externally to FPGA 103.

Figure 10:
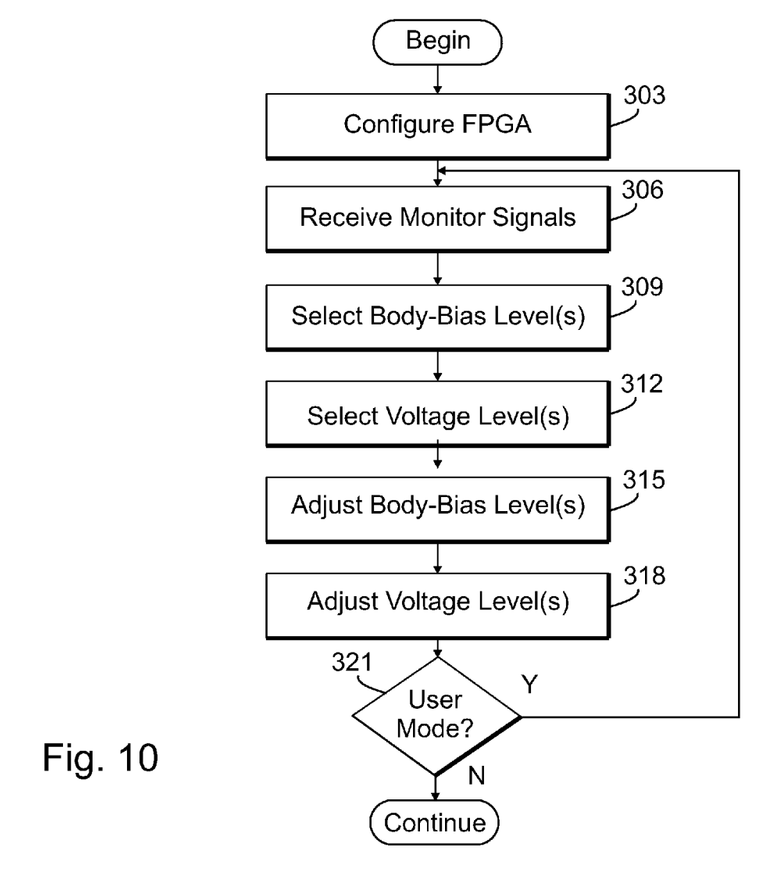
FIG. 10 illustrates a flow diagram for configuring supply voltage(s) and body-bias value(s) according to an exemplary embodiment.

FIG. 10 depicts a flow diagram for controlling, adjusting, or configuring body-bias level(s) and supply voltage(s) according to an exemplary embodiment. At 303, the FPGA is configured using data relating to a user's design, to be implemented via the FPGA's resources, such as those described above. Once configured, the FPGA may be placed in user mode, i.e., implement the user's circuit, desired functionality, etc.

At 306, monitor signals are received. The monitor signals may constitute or provide indications of the levels of process, voltage, and temperature in a resource, such as circuit(s), transistor(s), block(s), and the like in FPGA 103, as described above.

At 309, one or more body-bias levels are determined or selected, based on the monitor signals, temperature margins, thermal budgets, etc. The body-bias level(s) may be determined in a variety of ways, such as look-up data or tables, formulas, etc., as persons of ordinary skill in the art understand. Configuration information (e.g., relatively high or low speed of operation) for the respective FPGA resource(s) may also be taken into account in the determination of body-bias level(s).

Similarly, at 312, one or more supply voltage(s) are determined or selected, based on the monitor signals, temperature margins, thermal budgets, etc. The supply voltage(s) may be determined in a variety of ways, such as look-up data or tables, formulas, etc., as persons of ordinary skill in the art understand. Configuration information (e.g., relatively high or low speed of operation) for the respective FPGA resource(s) may also be taken into account in the determination of supply voltage(s).

At 315, body-bias level(s) for the respective FPGA resource(s) are adjusted or controlled. Similarly, at 318, supply voltage(s) for the respective FPGA resource(s) are adjusted or controlled.

At 321, a check is made to determine whether the FPGA is operating in user mode. If so, control returns to 306. Using the technique illustrated in the flow diagram, the body-bias level(s) and supply voltage(s) of one or more FPGA resources may be adjusted, programmed, or controlled. In this manner, the performance, such as power dissipation, speed of operation, etc. of one or more parts, blocks, circuits, transistors, and the like, of FPGA 103 may be controlled, improved, or optimized by dynamically adjusting or controlling the respective body-bias level(s) and supply voltage(s).

Although the above disclosure describes in part techniques and circuitry for improving the performance of FPGAs, the disclosed concepts apply generally to ICs with programmable or configurable circuitry. Such ICs may be known to persons of ordinary skill in the art as programmable logic devices (PLDs), complex PLDs (CPLDs), and the like.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art understand. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art may use certain features of the disclosed concepts independently of the use of other features, without departing from the scope of the disclosed concepts.

The invention claimed is:

1. An apparatus, comprising:
   a temperature sensor adapted to provide a temperature signal;
   a voltage regulator, adapted to supply at least one output voltage; and
   a field programmable gate array (FPGA), comprising:
      at least one circuit to receive the at least one output voltage of the voltage regulator;
      a set of monitor circuits adapted to provide indications of process and temperature for the at least one circuit;
      a controller adapted to derive a body-bias signal and a voltage-level signal from the temperature signal, from the indications of process and temperature for the at least one circuit, and from the at least one output voltage of the voltage regulator,
      wherein the controller is further adapted to provide the body-bias signal to at least one transistor in the at least one circuit, and to provide the voltage-level signal to the voltage regulator.

2. The apparatus according to claim 1, wherein the body-bias signal adjusts a body bias of the at least one transistor in the at least one circuit.

3. The apparatus according to claim 1, wherein the voltage-level signal is used to adjust the at least one output voltage of the voltage regulator.

4. The apparatus according to claim 3, wherein the voltage regulator resides within the FPGA.

5. The apparatus according to claim 1, wherein the temperature sensor resides within a package of the FPGA.

6. The apparatus according to claim 1, wherein the at least one circuit comprises programmable logic.

7. The apparatus according to claim 1, wherein the at least one circuit comprises programmable interconnect.

8. The apparatus according to claim 1, wherein the temperature signal comprises an indication of an ambient temperature.

9. The apparatus according to claim 1, wherein the body-bias signal and the voltage-level signal are further derived from configuration information about the at least one circuit.

10. The apparatus according to claim 9, wherein the configuration information about the at least one circuit comprises an operating speed of the at least one circuit.

11. The apparatus according to claim 10, wherein the configuration information about the at least one circuit comprises a power consumption of the at least one circuit.

12. The apparatus according to claim 10, wherein the configuration information about the at least one circuit comprises a thermal budget of the at least one circuit.

13. The apparatus according to claim 1, wherein the indication of temperature for the at least one circuit comprises a junction temperature of at least one junction in the at least one circuit.

14. A method of operating a field programmable gate array (FPGA), the method comprising:
   sensing a temperature of an operating environment of the FPGA;
   monitoring at least one circuit in the FPGA to determine indications of process and temperature;
   generating a body-bias signal derived from the sensed temperature and from the determined indications of process and temperature; and
   generating a voltage-level signal derived from the sensed temperature and from the determined indications of process and temperature.

15. The method according to claim 14, wherein sensing the temperature of the operating environment of the FPGA comprises sensing an ambient temperature.

16. The method according to claim 14, further comprising supplying the body-bias signal to at least one transistor in the at least one circuit.

17. The method according to claim 16, further comprising using the voltage-level signal to adjust an output voltage of a voltage regulator that supplies power to the at least one circuit.

18. The method according to claim 14, wherein the body-bias signal is further derived from configuration information about the at least one circuit.

19. The method according to claim 14, wherein the voltage-level signal is further derived from configuration information about the at least one circuit.

20. The method according to claim 14, wherein the indication of temperature comprises a junction temperature of at least one junction in the at least one circuit.

21. An apparatus, comprising:
- a temperature sensor adapted to provide a temperature signal;
- a voltage regulator, adapted to provide at least one output voltage; and
- a field programmable gate array (FPGA), comprising:
    - at least one circuit in the FPGA adapted to receive the at least one output voltage of the voltage regulator;
    - a set of monitor circuits adapted to provide indications of process and temperature for at least the one circuit;
    - a controller adapted to generate and to provide to the at least one circuit a body-bias signal and a voltage-level signal from the temperature signal, from the indications of process and temperature for the at least one circuit, and from the at least one output voltage of the voltage regulator,
    - wherein the body-bias signal and the voltage-level signal are generated so as to improve a performance of the at least one circuit while meeting a thermal budget of the at least one circuit.

22. The FPGA according to claim 21, wherein the body-bias signal and the voltage-level are further derived from configuration information about the at least one circuit.

23. The FPGA according to claim 22, wherein the configuration information comprises an operating speed of the at least one circuit.

24. The FPGA according to claim 22, wherein the configuration information comprises a power consumption of the at least one circuit.

25. The FPGA according to claim 21, wherein the indication of temperature for the at least one circuit comprises a junction temperature of at least one junction in the at least one circuit.

* * * * *